Dec. 23, 1952 G. W. WALLIN Re. 23,605
TUNING SYSTEM
Original Filed Aug. 13, 1947 2 SHEETS—SHEET 1
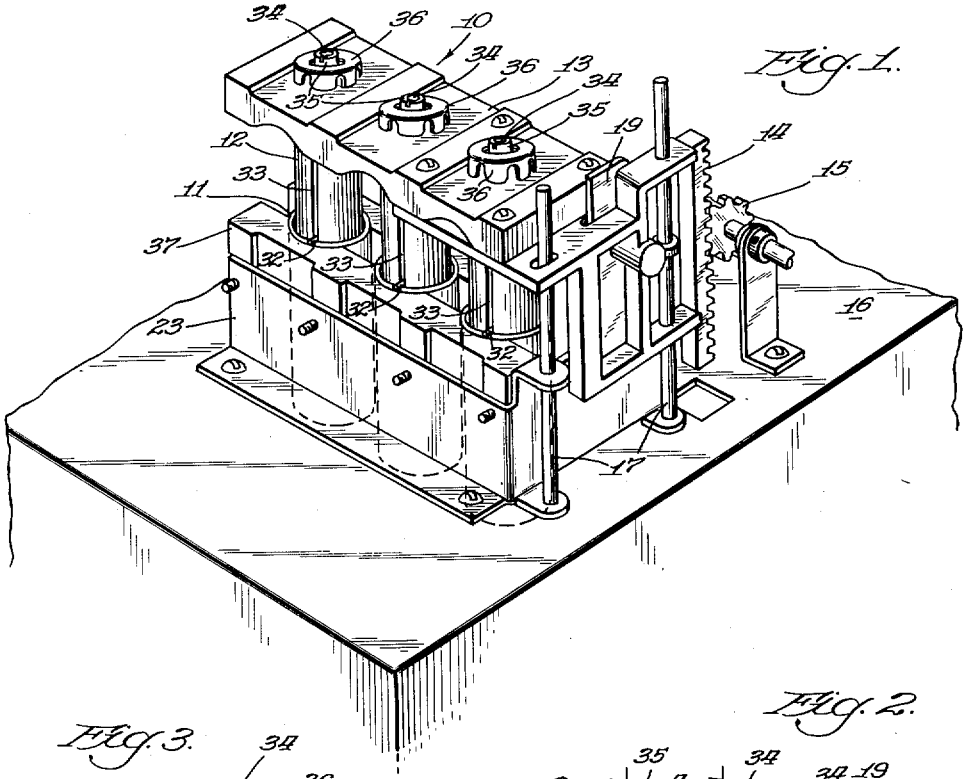
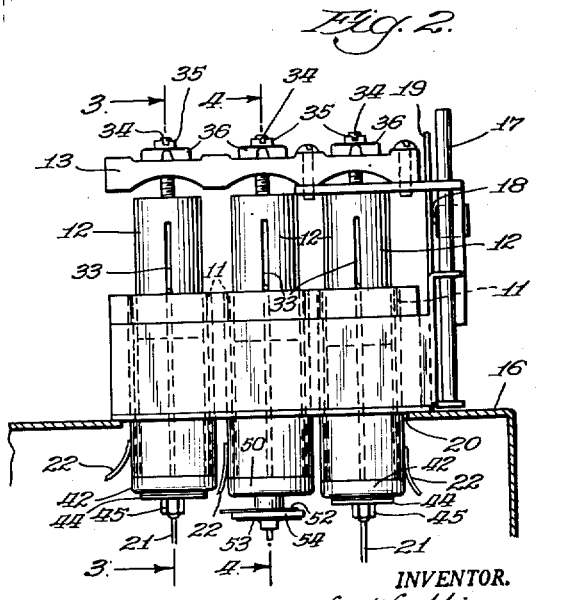
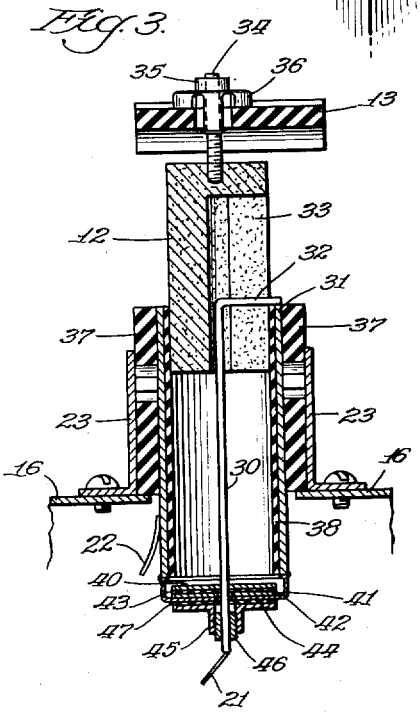
INVENTOR.
Gus W. Wallin
BY
Thomas L. Mueller
Atty.

TUNING SYSTEM

Original Filed Aug. 13, 1947 2 SHEETS—SHEET 2

INVENTOR.
Gus W. Wallin
BY
Foorman L. Muelly Atty.

Reissued Dec. 23, 1952

Re. 23,605

UNITED STATES PATENT OFFICE 23,605

TUNING SYSTEM

Gus W. Wallin, Chicago, Ill., assignor to Motorola, Inc., Chicago, Ill., a corporation of Illinois Original No. 2,496,322, dated February 7, 1950, Serial No. 768,382, August 13, 1947. Application for reissue May 29, 1950, Serial No. 165,082

28 Claims. (Cl. 250—40)

Matter enclosed in heavy brackets [ ] appears in the original patent but forms no part of this reissue specification; matter printed in italics indicates the additions made by reissue.

This invention relates generally to tunable resonant systems and more particularly to a transmission line tuning system adapted for use in very high frequency systems such as presently used for frequency modulation and television receivers.

In the design of radio receivers for operation in the very high frequency band such as the 88 to 108 megacycles band now assigned for frequency modulation receivers, various difficulties are involved which are not present in the design of receivers in the lower frequency bands as used for standard amplitude modulation broadcast reception. Many of these problems relate to tuner design, and present condenser and permeability tuners have not been satisfactory. In dealing with such high frequencies, even when the tuning inductance is made as small as practicable, the capacity required for tuning is relatively small. Accordingly, any changes in the inductance or capacity of tubes or other components due to manufacturing tolerances and also changes while in use, such as that caused by heating, have a very substantial effect. These changes in inductance and capacity cause the frequencies to drift and in particular produce instability in the oscillator circuit. This frequency drift is particularly important in push button receivers wherein the desired channels are pre-set and merely selected by the operator of the receiver. As push button tuning has become very popular and is considered almost essential in present day receivers, a tuning system adaptable to push button operation is highly desirable.

Further, in the very high frequency band, difficulty is encountered in obtaining the desired selectivity, that is, rejection of adjacent stations. This is due to the fact that to provide conventional tuning elements having the values required at this frequency the resulting circuit has a very low Q. The low Q of such circuits also limits the stable gain that can be obtained therefrom.

It is, therefore, an object of the present invention to provide an improved tuner for use in the very high frequency range.

It is a further object of the present invention to provide a tuning system for use in the very high frequency range which provides sufficient stability to permit push button operation.

Another object of the present invention is to provide a tunable resonant circuit for use in the very high frequency range in which the effective Q of the circuit is very high providing good selectivity and permitting high gain.

It is a still further object of the present invention to provide a tuning unit for use in very high frequency receivers in which the tuning components are provided in a single relatively inexpensive unit.

A feature of this invention is the provision of a tuning unit including a pair of series connected coaxial conductors with a movable iron core for varying the permeability thereof and a concentric capacitor having plates connected to said conductors.

Another feature of this invention is the provision of a tuning unit for use with very high frequencies including a variable inductance and a tuning condenser made as an integral unit so that the effect of the inductance of leads is substantially reduced.

A further feature of this invention is the provision of a resonant circuit including a transmission line tuning unit having spaced conductors and an integral capacitor including plates connected to said conductors in which said plates are movable with respect to each other to provied initial tuning of the resonant circuit.

Still another feature of the present invention is the provision of a resonant circuit including a tuning unit with a tunable coaxial transmission line and a plurality of capacitors including plates some of which are secured to the conductors of the transmission line to provide a pair of capacitors connected in series across the transmission line providing a center tap connection thereto.

A still further feature of this invention is the provision of a tuner for tuning a plurality of circuits so that the resonant frequencies of the circuits have a predetermined relation throughout a band of frequencies, including tuning units in each circuit having integral inductors and capacitors, with the capacitors being variable to provide the desired frequency relation at one set of frequencies and the inductors being constructed to tune said circuits through said band of frequencies while substantially maintaining said frequency relation.

Further objects, features and advantages will be apparent from the following description taken in connection with the accompanying drawings in which:

Fig. 1 is a perspective view showng the tuner in accordance with the invention;

Fig. 2 is a front view of the tuner of Fig. 1;

Fig. 3 is a cross-sectional view of one section of the tuner along the lines 3—3 of Fig. 2;

Figure 5:
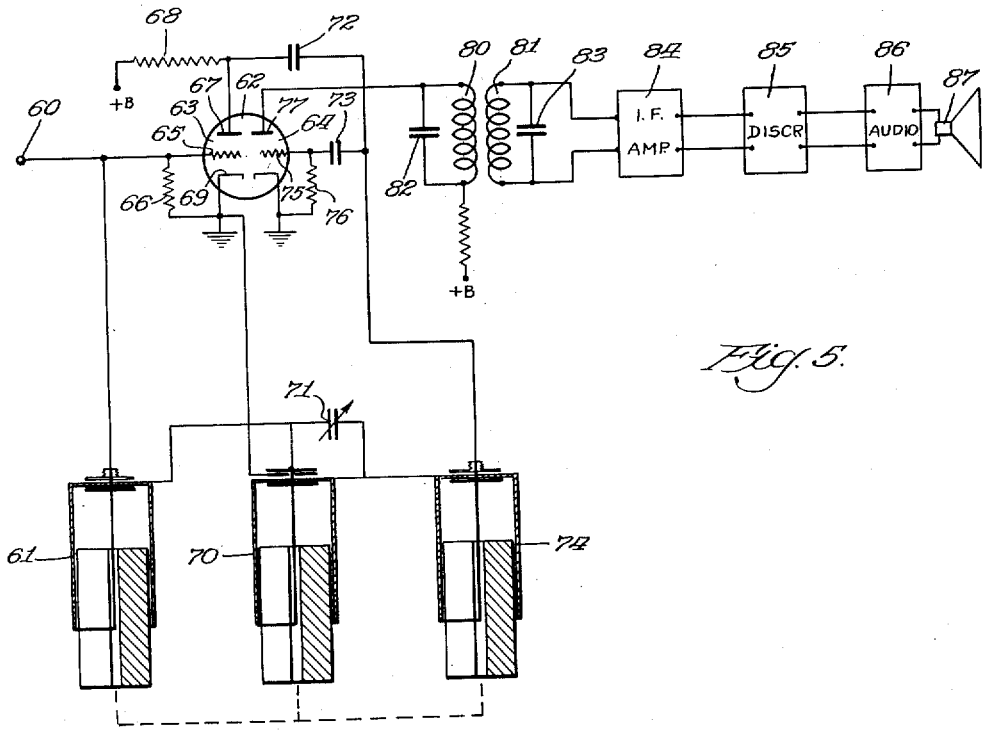
Fig. 5 is a circuit diagram illustrating the use of the tuner in accordance with the invention.

In practicing the invention there is provided a tuner including a plurality of tuning units comprising a short section of a transmission line including a center conductor and a coaxial outer conductor. The conductors are connected together at one end so that they are in effect connected in series and the inductance thereof is varied by use of a ferromagnetic core which is movable within the space between the conductors. Concentric capacitors are provided at the open ends of the conductors having plates some of which are connected to the conductors so that the capacitors are connected in parallel across the conductors. Arrangements are provided in which one of the plates is movable with respect to another plate to provide a trimmer capacitor for use in aligning the circuit being tuned. An arrangement is also provided wherein a pair of condensers are connected in series across the conductors to provide a center tap for the resonant circuit provided thereby. The tuning units can be arranged to have different frequency characteristics so that a plurality of units can be ganged to tune a plurality of circuits in such a manner that a desired frequency relation is established in the circuits throughout a band of frequencies.

Referring now to the drawings there is illustrated in Figs. 1 and 2 a tuner 10 in accordance with the invention including three tuning units 11. The individual tuning units include a tunable transmission line and one or more capacitors. The tunable transmission line is disclosed and claimed in my copending application Serial No. 625,145, filed October 29, 1945. For varying the inductance of the coaxial transmission lines, ferromagnetic cores 12 movable in the space between the conductors of the transmission lines are provided. The core may also have some effect on the distributed capacity of the transmission line as the binder used may have a dielectric constant greater than unity, but this effect is not substantial in the present application and the transmission line will be considered as a variable inductance. In Fig. 1 a plurality of cores 12 associated with the tuning units 11 are connected to a common carriage 13 for movement in unison to simultaneously tune a plurality of circuits as will be fully described. For moving the carriage 13 a rack and pinion mechanism is provided including a rack 14 which is a part of the carriage 13 and a pinion 15 which is mounted on the chassis 16. The carriage 13 slides on rods 17 supported on the frame 23, the rods limiting the carriage to a linear up and down movement. As is apparent in Fig. 2, a spring biased ball 18 bears against a portion 19 of the frame to hold the carriage in a predetermined position. The tuner is mounted on the chassis 16 in an opening 20 in the chassis so that the ends of the tuning units 11 extend through the opening and connections can be made thereto from the bottom of the chassis.

In Fig. 3 there is illustrated a cross-sectional view of one of the tuning units in accordance with the invention showing the details of the unit. In this figure the center conductor is indicated by 30 and the outer conductor by reference numeral 31. As is apparent, the inner conductor 30 has a portion 32 which is bent over and electrically connected to the outer conductor 31. The movable ferromagnetic core 12 includes a slot 33 therein which permits the core to be moved into the space between the center conductor 30 and the outer conductor 31. Insulation 38 is provided between the core 12 and the cylindrical conductor 31. This may be a sleeve secured to the conductor 31 as illustrated or may be a coating on either the conductor 31 or the core 12. As previously stated, the core 12 is moved by a carriage 13 and is preferably adjustably connected thereto. The connection between the core and carriage is illustrated as including a bolt 34 secured to the core 12 and a nut 35 secured to the carriage 13 by clip 36. This permits relative adjustment of the position of the core with respect to the carriage 13. The outer conductor 31 of the tuning unit is secured between two insulating members 37 which are supported by the frame structure 23 of the tuner.

To provide a capacity for tuning the transmission line, a plurality of concentric capacitors may be connected directly to the transmission line and constructed as an integral part of the tuning unit. Fig. 3 illustrates such a capacitor including a plate 40 which is connected to the center conductor 30 and a plate 41 which is electrically connected to and supported by an annular cup-shaped member 42 connected to the outer conductor 31. A suitable dielectric material 43 is provided between the plates 40 and 41 which may be mica. As the plates 40 and 41 are connected respectively to the conductors 30 and 31, the capacitor is bridged across the transmission line. An additional capacitor is also provided bridged across the transmission line, the cup-shaped member 42 and the movable plate 44 forming the plates of this condenser. For permitting adjustment of this capacitor, the plate 44 has a threaded projecting portion 45 which engages threads on a ring 46 secured to the center conductor 30. This permits the plate 44 to be moved with respect to the member 42 to provide a trimmer condenser across the transmission line. Insulating material 47 is provided between the plates 42 and 44 to prevent shorting of the transmission line when the trimmer condenser is being adjusted. Connections are made to the tuning unit including the transmission line and the capacitors by lead 21 connected to the center conductor 30 and lead 22 connected to the outer conductor 31. As the transmission line and capacitors which form the tuned circuit are directly connected as a unit, the effect of the inductance of the leads which is substantial at very high frequencies is reduced.

Figure 4:
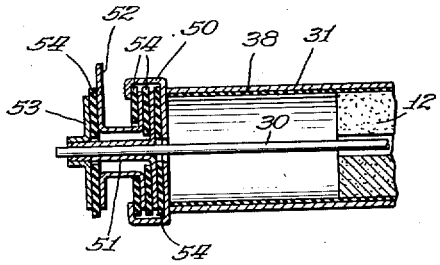
Fig. 4 is a fragmentary view of a portion of a tuner element along the lines 4—4 of Fig. 2.

Fig. 4 illustrates a different capacitor structure which may be combined with the transmission line to provide a tuning unit with a center connection to the resonant circuit as required in a Colpitts oscillator. In Fig. 4 the conductors 30 and 31 of the transmission line and the core 12 may be of identical construction to that of Fig. 3. A plurality of capacitors are provided by a plurality of annular concentric conducting members designated 50, 51, 52 and 53. It is noted that these various members are separated by a plurality of discs 54 made of suitable dielectric material such as mica. The member 50 is supported on and connected to the outer conductor 31 and the members 51 and 53 are both connected to the inner conductor 30. It is apparent that the members 50 and 51 provide a fixed capacitor bridged across the transmission line. The members 50, 52 and 53 form a pair of capacitors in series which are also bridged across the transmission line. That is, one capacitor is formed between member 50 connected to the outer conductor and member 52 which is isolated from both conductors and a second capacitor is formed between member 52 and members 51 and 53 which are connected to the center conductor. Member 52, therefore, forms a center tap in the resonant circuit as is required in certain applications. The dielectric discs 54 separate the conducting members to complete the capacitor structures.

Fig. 5 illustrates the use of a tuner in accordance with the invention in a very high frequency radio receiver. The circuit illustrated is of the double superheterodyne type in which a single oscillator is used for both converters. Referring specifically to Fig. 5, the terminal 60 is adapted to be connected to an antenna. Tuning units 61, 70 and 74 tune the antenna, oscillator and variable intermediate frequency, respectively. An electron discharge valve 62 is provided which includes two triode sections 63 and 64, the section 63 functioning as a combined oscillator and first converter, and the section 64 serving as a second converter. The antenna is connected to tuning unit 61 which may be of the construction illustrated in Fig. 3 and the signal selected is applied to the grid 65 of the triode section 63, the grid being biased by resistor 66. Operating potential is applied to the plate 67 of the triode 63 from +B voltage source through resistor 68. The cathode 69 is grounded and connected to the center tap of the local oscillator circuit provided by tuning unit 70 which is of the construction shown in Fig. 4. A separate trimmer capacitor 71 is required for aligning the oscillator circuit as a trimmer is not provided as an integral part of this tunng unit. The output of the first converter is a variable intermediate frequency which is tuned by the unit 74, being coupled thereto by capacitor 72. This signal is applied through capacitor 73 to the grid 75 of the second converter section 64 where the intermediate frequency is again beat with the oscillator frequency to provide a fixed intermediate frequency. The output of the second converter is applied from the plate 77 to inductively coupled coils 80 and 81 which are tuned by condensers 82 and 83 to the second fixed intermediate frequency. The coil 81 is coupled to an intermediate frequency amplifier 84 which may be of standard construction wherein the signals are amplified and then applied to discriminator 85. Amplitude modulation signals are derived in the discriminator and applied to audio amplifier 86 wherein they are amplified and applied to a sound reproducing device 87.

In systems actually constructed adapted for use in the frequency modulation band of from 88 to 108 megacycles utilizing the circuit of Fig. 5, a fixed second intermediate frequency of 4.3 megacycles has been used. In such a system the tuning unit 61 is, of course, adapted to be tuned to the signal frequency and the oscillator tuning unit 70 tuned to a frequency which is half the difference between the signal frequency and intermediate frequency (4.3 megacycles). The variable intermediate frequency differs from the oscillator frequency by the fixed intermediate frequency (4.3 megacycles) and the tuning unit 74 is arranged to be resonant at this frequency. Considering a 100 megacycle signal frequency, the oscillator frequency is 47.85 megacycles and the variable intermediate frequency is 52.15 megacycles. When this variable intermediate frequency is beat with the 47.85 megacycles oscillator in the second converter, the fixed intermediate frequency of 4.3 megacycles is produced as desired.

The physical characteristics of the transmission line are governed by the electrical characteristics desired. As previously stated, the lines are used essentially as variable inductances, the value of the inductances depending upon the length of the lines. The anti-resonant impedance of the line depends upon the ratio of diameter of the outer conductor to that of the inner conductor, a ratio of 9.2 to 1 having been found to provide maximum impedance. To provide a plurality of tuning units for tuning a plurality of circuits having a predetermined frequency relation between the circuits, the various transmission lines can be produced in different lengths to thereby provide the inductance ranges required by the circuits. For tuning a circuit through a frequency range from 88 to 108 megacycles a transmission line having an outer conductor approximately .8 of an inch in diameter and 2.65 inches in length has been used. The inner conductor had a diameter approximately .08 of an inch. By using a powdered iron core with relatively high permeability, the Q of the unit at 100 megacycles is approximately 335. Used in a circuit as illustrated in Fig. 5, the tube load reduced the Q to approximately 200. This is sufficiently high to permit high gain per stage and to provide good selectivity and image rejection. Such a unit has an inductance of the order of .03 microhenry at the high frequency end which requires a tuning capacity of approximately 250 micromicrofarads. As the oscillator and variable intermediate frequency circuits are of lower frequency, the inductance values will be slightly higher and the transmission lines will, therefore, be longer.

When using the tuner in accordance with the invention for tuning a plurality of resonant circuits, as, for example, in a double superheterodyne receiver as illustrated in Fig. 5, the various resonant circuits can be aligned at the low frequency end of the band by adjusting the relative position of the cores in the transmission lines and at the high frequency end by the use of the integral trimmer capacitors. Referring to Fig. 1, it is apparent that the cores 12 are adjustably secured to the carriage 13 by the nuts 35. Therefore, the circuits can be first aligned at the low frequency end by adjusting the position of the cores 12 with respect to the carriage 13 so that the various resonant circuits have the desired frequency relation. Then the circuits can be tuned to the high frequency end of the band and aligned by adjusting the position of the plates 44 of the trimmer capacitors (Fig. 3). As the various tuning units will be of generally the same configuration, the calibration of the individual units will follow substantially the same characteristics so that the desired frequency relation will be substantially maintained throughout the entire frequency band. As will be explained, the conductors of the transmission line can be shaped as in Fig. 6 to provide a relatively straight line frequency characteristic. It is readily apparent that by proper design of the conductors special frequency characteristics can be obtained. The frequency characteristics of the tuning units also depend upon the permeability of the material used in the core and, therefore, by using materials of different permeability in various tuning units, specific desired frequency characteristics can be obtained. For example, in the circuit illustrated in Fig. 5 the transmission lines in the three circuits could be made the same length, and by using cores of higher permeability, the inductance can be increased to provide the frequency relation in the three circuits required.

Figure 6:
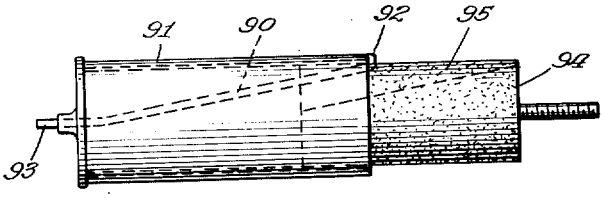
Fig. 6 illustrates a modification tuning element in accordance with the invention.

The calibration of the tuning units as disclosed above is generally similar to that of a variable condenser resulting in "bunching" of the channels at the higher frequency end. It has been found that a more nearly straight line frequency characteristic can be obtained by changing the configuration of the conductors of the transmission line. In Fig. 6 there is illustrated a modified structure in which the center conductor 90 slants with respect to the outer conductor 91, being positioned adjacent the outer conductor at point 92 where it is connected thereto and being substantially centrally located with respect to the outer conductor at the open end 93. An iron core 94 can be generally similar to that in the previous modifications except that a slanting slot 95 conforming generally to the slant of the center conductor 90 is required. In some applications the use of a unit such as disclosed in Fig. 6 may be desired to provide a more uniform frequency distribution. For example, this arrangement may in some instances facilitate tracking of various circuits which are ganged for operation of single control. It is obvious that in the unit of Fig. 6, fixed, trimmer or center tapped capacitors can be provided as an integral part of the unit in the same manner as in Figs. 3 and 4.

Extensive tests made using tuning units in accordance with the invention have been highly satisfactory. The units can be very inexpensively constructed as the dimensions thereof are not critical. Using materials with maximum commercial tolerances for the inner and outer conductors, the variation in the inductance of the transmission line is only plus or minus ½% from nominal. This is sufficiently accurate that the units can be fabricated without electrical checking thereby materially reducing the cost of the units. The provision of the capacitors as an integral part of the tuning unit further decreases the cost and provides a high degree of uniformity in production not possible in the construction of separate units.

The operation of circuits utilizing the tuning units described is very good as the inductances of the transmission line is substantially less than that of other commercially practicable variable inductances permitting the use of a tuning capacity which is correspondingly larger. Therefore, the effect of the changing capacity of components due to warm-up, etc., is much less and the frequency drift caused thereby is correspondingly less. As the inductances and capacitors which form the resonant circuits are formed as an integral unit, the effect of lead inductance which is substantial at very high frequencies is materially reduced. The resulting resonant circuits have a very high Q making for stability, high gain and good selectivity.

Although I have described certain embodiments of my invention it is apparent that various changes and modifications can be made therein without departing from the intended scope of the invention as defined in the appended claims.

I claim:

1. A tunable resonant circuit comprising a transmission line including a pair of series connected spaced coaxial conductors, a ferromagnetic core movable in the space between said conductors for varying the inductance thereof, capacitor means including a plurality of plates mounted on said transmission line at the open end thereof, each of said plates being electrically connected to one of said conductors to provide a plurality of capacitors bridged across said transmission line, and means for movably mounting one of said plates on said conductor to which it is connected so that said one plate can be moved with respect to the other of said plates for varying the capacity of at least one of said capacitors.

2. A tuning unit comprising a transmission line including a pair of spaced coaxial conductors, means for varying the electrical characteristics of the medium separating said conductors, capacitor means including a plurality of plates mounted on said transmission line having dielectric material therebetween, a pair of said plates being individually electrically connected to said conductors, and an additional one of said plates being positioned between said pair of plates to provide a pair of capacitors connected in series across said transmission line.

3. A tuning unit comprising a transmission line including a central conductor and an outer cylindrical conductor coaxial therewith, said conductors being connected in series, a ferromagnetic core movable in the space between said conductors for varying the inductance thereof, capacitor means including a plurality of annular plates of substantially the same diameter as said outer conductor mounted on said transmission line and separated by dielectric material, certain of said plates being electrically connected to said conductors to provide a first capacitor bridged across said transmission line and a pair of additional capacitors connected in series across said transmission line.

4. A wave signal receiver including a plurality of resonant circuits having a predetermined frequency relation through a band of frequencies, a tuning unit in each circuit for tuning the same, each of said units including a transmission line having a center conductor and a spaced cylindrical outer conductor, said conductors being coaxial and coextensive and interconnected at one end, a ferromagnetic core movable in the space between said conductors for varying the inductance thereof, and capacitor means including a plurality of annular plates of substantially the same diameter as said outer conductor mounted on said conductors at the open end thereof, each of said plates being connected to one of said conductors to provide a plurality of capacitors bridged across said transmission line, one of said plates being movable with respect to the other of said plates to permit varying the capacity of one of said capacitors for aligning said circuits.

5. A wave signal receiver including a plurality of resonant circuits tunable to frequencies having a predetermined frequency relation through a band of frequencies, a tuning unit in each circuit for tuning the same, each of said units including a transmission line having a pair of series connected spaced coaxial conductors, means for varying the inductance of said conductors, capacitor means including a plurality of plates mounted on said transmission line and electrically connected to said conductors to provide a pair of capacitors bridged across said transmission line, one of said plates being movable with respect to said other plates so that one of said capacitors is variable, common operating means for said inductance varying means for simultaneously tuning said plurality of circuits, and adjustable means for connecting said inductance varying means to said common operating means for aligning said circuits at the low frequency end of said band, said variable capacitors being adapted to be used for aligning said circuits at the high frequency end of said band.

6. A resonant circuit comprising a tuning unit including a tunable transmission line having a pair of spaced conductors and a ferromagnetic core movable in the space between said conductors for varying the inductance thereof, and a capacitor bridged across said transmission line, said conductors being positioned with respect to each other so that the movement of said core with respect to said conductors produces a change in the resonant frequency of said circuit which varies substantially linearly with movement of said core.

7. A tuning unit for use with a wave signal receiver comprising a transmission line including a center conductor and a cylindrical outer conductor coaxial therewith, said conductors being substantially coextensive in length, means supporting said center conductor from said outer conductor and electrically connecting said conductors at one end thereof, and a ferromagnetic core movable in the space between said conductors for varying the inductance of said serially connected conductors, said core being insulated from said conductors and having a slot therein to clear said center conductor and said supporting means when said core is moved with respect to said conductors.

8. A tuning unit for use with a wave signal receiver comprising a transmission line including an inner conductor and a cylindrical outer conductor, said inner conductor being connected at one end to one end of said outer conductor and extending in substantially a straight line from the periphery of said outer conductor at said one end to the axis of said outer conductor at the end thereof opposite to said one end, and a ferromagnetic core movable in the space between said conductors and insulated therefrom for varying the inductance of said serially connected conductors.

9. A tuning unit for use with a wave signal receiver comprising a transmission line including an inner conductor and a cylindrical outer conductor, said inner conductor being connected at one end to one end of said outer conductor and extending in substantially a straight line from the periphery of said outer conductor at said one end to the axis of said outer conductor at the end thereof opposite to said one end, and a ferromagnetic core movable in the space between said conductors and insulated therefrom for varying the inductance of said serially connected conductors, said core having a slot therein to clear said inner conductor when said core is moved with respect to said conductors.

10. A wave signal receiver including a plurality of resonant circuits tunable to different frequencies having a predetermined frequency relation through a band of frequencies, tuner means for said receiver including a tuning unit in each of said circuits for tuning the same, each of said tuning units including a tunable transmission line having a pair of spaced conductors and a magnetic core movable in the space between said conductors for varying the inductance thereof, said conductors being positioned with respect to each other so that the movement of said core with respect to said conductors produces a change in the resonant frequency of the associated circuit which varies substantially linearly with movement of said core, and means for simultaneously moving said cores with respect to said conductors, said tuning units being so constructed that simultaneous movement of said cores provides the inductance required in said circuits to substantially maintain said predetermined frequency relation through the desired band of frequencies.

11. In a wave signal receiver including a plurality of resonant circuits tunable to frequencies having a predetermined frequency relation through a band of frequencies, a tuner comprising a plurality of tunable transmission lines connected in said circuit for tuning the same, each of said lines including outer and inner spaced conductors and a ferromagnetic core movable in the space between said conductors for varying the inductance thereof, condenser means connected across said transmission lines including plates mounted on and electrically connected to said conductors, insulating frame means supporting said outer conductors to form a unitary structure, and a movable carriage supporting said cores for simultaneously moving said cores with respect to said conductors.

12. A tuning unit for use with a wave signal receiver comprising, a transmission line including a center conductor and a cylindrical outer conductor coaxial therewith, a core movable in the space between said conductors for varying the electrical characteristics of the medium separating said conductors, a conducting member connected to said conductors at one end thereof for electrically and mechanically interconnecting the same, and a concentric capacitor connected across said transmission line at the end thereof opposite to said one end, said capacitor including plates individually connected electrically and mechanically to said conductors, said core being of such configuration to be insertable in said outer conductor at said one end thereof and to clear said inner conductor and said conducting member.

13. A tunable resonant circuit for use with a wave signal receiver comprising, a pair of spaced coaxial conductors, a concentric capacitor at one end of said conductors including plates individually secured to said conductors and electrically connected thereto, conducting means electrically interconnecting said coaxial conductors at points spaced from said capacitor, and a core movable in the space between said conductors for varying the electrical characteristics of the medium therein, said core being of such configuration to be insertable in the space between said conductors at the end thereof opposite to said one end and to be spaced from said conductors and said conducting means during movement thereof.

14. A wave signal receiver including a plurality of resonant circuits, a tuning unit in each circuit for tuning the same, each of said units including a transmission line having a center conductor and a coaxially spaced cylindrical outer conductor, conducting means at one end of said transmission line electrically interconnecting said conductors, a ferromagnetic core movable in the space between said conductors for varying the inductance thereof, said core being insulated from said outer conductor and being of such configuration to clear said center conductor and said conducting means during movement of said core, and capacitor means secured to said transmission line at the end thereof opposite to said one end, said capacitor means including a plurality of annular plates of substantially the same diameter as said outer conductor, each of said plates being connected to one of said conductors to provide a plurality of capacitors bridged across said transmission line.

15. A tunable resonant circuit comprising, a transmission line including a pair of spaced conductors, conducting means at one end of said transmission line electrically and mechanically interconnecting said conductors, a capacitor at the end of said transmission line opposite to said one end including a pair of plates secured to said conductors and individually electrically connected thereto, and a ferromagnetic core movable with respect to said conductors in the space therebetween, said core being insulated from said conductors and being of such configuration to clear said conducting means and to permit movement of said core past said one end of said transmission line.

16. A tuning unit for use with a wave signal receiver comprising, a transmission line including a center conductor and a cylindrical conductor coaxial therewith, means electrically interconnecting said conductors at one end of said transmission line, a core movable in the space between said conductors for varying the permeability of the medium therein, said core being of such configuration to be insertable in the space between said conductors at said one end and to be spaced from said conductors and said conducting means during movement of said core and a capacitor, including a pair of spaced circular plates, secured to said transmission line at the end thereof opposite to said one end, said circular plates having substantially the same outside diameter as said cylindrical conductor, one of said plates being connected at the center thereof to said center conductor and the other of said plates being connected at the edge thereof to said cylindrical conductor to close said opposite end of said transmission line, whereby said capacitor is electrically bridged across said transmission line, and with one of said plates being adjustable in a direction longitudinally of the unit and relative to the other plate to vary the capacity of the capacitor.

17. A tuning unit comprising an outside open-ended cylindrical conductor defining substantially the outside dimensional limits in cross-section of the unit, an inside rod-like conductor within said outside conductor and longitudinally thereof and secured at one end in an electrical and physical connection to said outside conductor at one open end thereof, means substantially in said dimensional limits at the other open end of said outside conductor supporting and centering the corresponding end of the inside conductor and providing in combination an electrical connection at that end between said inside and said outside conductors and a capacitor, said means at said other open end including a plurality of plate means with one of said plate means in electrical connection with said center conductor and with another plate means operatively connected physically with said outer conductor and electrically connected thereto, with at least one plate means being adjustable in a direction generally toward and away from said other open end to vary the distance between the named plate means, and a movable core within the cylindrical conductor of such configuration as to be maintained out of contact with said inside conductor, with said core being insertable at said one end for movement to vary the permeability thereof.

*18. A tuning unit for use with a wave signal receiver including in combination, a transmission line including a cylindrical outer conductor, an inner conductor having a portion extending substantially coaxial with said outer conductor, said inner conductor having a projecting portion extending transversely from said coaxially extending portion and electrically connected to said outer conductor, and a core movable in the space between said conductors for varying the electrical characteristics of the space therebetween, said core being insulated from said conductors and having a slot therein to clear said coaxial and projecting portions of said inner conductor when said core is moved with respect to said conductors and past said transversely projecting portion.*

*19. A tuning unit tunable over a range of frequencies including in combination, longitudinally extending outer conductor means having an inner longitudinal cavity therein, inner conductor means including a rod-like conducting portion extending longitudinally within said cavity in said outer conductor means and a conducting arm portion extending transversely in the space between said rod-like conducting portion and said outer conductor means and electrically and mechanically interconnecting said rod-like conducting portion and said outer conductor means, and an elongated core element having a cross-section proportioned to substantially conform to the cross-section of said cavity within said outer conductor means and being slotted longitudinally thereof to permit movement of said core element past said arm portion, said core element and said outer conductor means being electrically insulated from each other and adjustable relative to each other to change the electrical characteristics of the medium separating said outer conductor means and said conducting portion to thereby adjust the resonant frequency of the tuning unit.*

*20. A tunable resonant circuit for use with a wave signal receiver including in combintion, first conducting means having a conductor portion forming the central conductor of a coaxial transmission line, second conducting means having a conductor portion forming the outer cylindrical conductor of said coaxial transmission line, said first conducting means including a projecting portion extending transversely from said central conductor portion at one end thereof and electrically connected to said cylindrical conductor portion to form a closed transmission line, said first and second conducting means each having a conducting portion at the end thereof opposite to said one end, said conducting portions being spaced from each other to form a condenser connected across said transmission line, and a core movable in the space between said coaxial conductor portions for varying the electrical characteristics of the medium therein, said core being of such configuration to be insertable in the space between said outer cylindrical conductor portion and said central conductor portion at said one end thereof past said projecting portion, and to be spaced from said conductor portions and said projecting portion during movement of said core.*

*21. A tunable resonant circuit for use with a wave signal receiver including in combination,* first conducting means having a conductor portion forming the central conductor of a coaxial transmission line, second conducting means having a conductor portion forming the outer cylindrical conductor of said coaxial transmission line, said first conducting means including a projecting portion extending transversely from said central conductor portion at one end thereof and electrically connected to said cylindrical conductor portion to form a closed transmission line, said first and second conducting means having spaced conducting portions at the end thereof opposite to said one end forming condenser means connected across said transmission line, at least a part of one of said conducting portions being movable with respect to another one of said conducting portions to change the capacity of said condenser means, and an elongated core movable in the space between said coaxial conductor portions for varying the electrical characteristics of the medium therein, said core being of such configuration to be insertable in the space between said coaxial conductor portions and having a longitudinal slot therein to clear said transversely projecting portion and thereby permit movement of said core past said transversely projecting portion.

22. A tunable resonant circuit including first and second conducting means, said conducting means individually including conductor portions forming a coaxial transmission line, one of said conducting means including a projecting portion extending transversely between said conductor portions and electrically interconnected to the other one of said conducting means so that said transmission line is closed at one end, an elongated ferromagnetic core movable in the space between said conductor portions for varying the inductance thereof, said core having a longitudinal slot therein to permit movement of said core past said transversely projecting portion, said conducting means individually including conducting portions at the open end of said transmission line, said conducting portions being spaced with respect to each other to form a plurality of capacitors bridged across said transmission line, and means for movably mounting one of said conducting portions with respect to another one of said conducting portions for varying the capacity of at least one of said capacitors.

23. A wave signal receiver including in combination a plurality of resonant circuits having a predetermined frequency relation through a band of frequencies, a tuning unit in each circuit for tuning the same, each of said units including first and second conducting means individually having conductor portions forming a center conductor and a spaced cylindrical outer conductor of a coaxial transmission line, one of said conducting means of each unit including a projecting portion extending transversely between said conductor portions and electrically interconnected to the other one of said conducting means, an elongated ferromagnetic core movable in the space between said conductors of each unit for varying the inductance thereof, said core having a longitudinal slot therein to permit movement of said core past said transversely projecting portion, said conducting means individually including conducting portions with the conducting portions of each unit spaced with respect to each other to provide at least one capacitor bridged across the transmission line of the unit, one of said conducting portions of each unit being movable with respect to another one of said conducting portions to provide variation in the capacity of one of said capacitors for aligning said circuits.

24. A device for tuning a high frequency circuit, comprising an elongated high permeability core member provided with a radial slot extending lengthwise of it, and an electrical conductor member having ends adapted to be connected in said circuit, said conductor having a portion extending from one of said ends into said slot and lengthwise of the inside of the core and having another portion extending along the outside of the core lengthwise thereof, whereby to provide small inductance for said circuit, and one of said members being movable relative to the other to vary said inductance.

25. A device for tuning a high frequency circuit, comprising a tubular metal case, an elongated high permeability core disposed in the case and slidable lengthwise through an open end thereof, said core being provided with a radial slot extending lengthwise of it, and a metal conductor element extending into said slot adjacent said open end of the case and then lengthwise of the inside of the core toward the opposite end of the case, one end of said element engaging the case, and one end of the case and the free end of said element being adapted to be connected in said circuit, whereby an inductive circuit is formed through said element and case which can be varied by sliding the core or case lengthwise relative to the other.

26. A device for tuning a high frequency circuit, comprising an elongated high permeability core member provided with a radial slot extending lengthwise of it, and an electrical conductor member having ends adapted to be connected in said circuit, said conductor having substantially parallel straight portions extending lengthwise of the core member, one of said portions extending from one of said ends into said slot and lengthwise of the inside of the core member, and the other of said portions extending lengthwise of the outside of the core member, whereby to provide small inductance for said circuit, one of said members being movable relative to the other to vary said inductance.

27. A device for tuning a high frequency circuit, comprising an elongated high permeability core member provided with a radial slot extending lengthwise thereof, and a conducting member having ends adapted to be connected in said circuit, said conducting member having a first portion extending into said slot and lengthwise of the inside of said core and having another portion extending along the outside of said core, whereby to provide small inductance for the circuit, and one of said members being movable lengthwise relative to the other to vary the amount of said first portion of said conducting member inside the core in order to vary said inductance.

28. A variable inductance for very high frequency circuits including a movable elongated core of low permeability, a first conducting element of low inductance, a second conducting element of considerably higher inductance, means connecting said elements in series in additive sense, one of said elements being an outer element and the other element being an inner element located inside said outer element, said core having a cross section of such dimensions to be movable within said outer element and including a cavity extending lengthwise thereof to ac-

*commodate said inner element to thereby produce inductance variations in both elements.*

GUS W. WALLIN.

REFERENCES CITED

The following references are of record in the file of this patent or the original patent:

UNITED STATES PATENTS

| Number | Name | Date |
|---|---|---|
| 1,955,093 | Roosenstein | Apr. 17, 1934 |
| 2,097,519 | Gabriel | Nov. 2, 1937 |
| 2,153,205 | Park | Apr. 4, 1939 |
| 2,157,855 | Kock | May 9, 1939 |
| 2,286,428 | Mehler | June 16, 1942 |

| Number | Name | Date |
|---|---|---|
| 2,402,948 | Carlson | July 2, 1946 |
| 2,408,895 | Turner | Oct. 8, 1946 |
| 2,497,662 | Dressel | Feb. 14, 1950 |
| 2,518,938 | Polydoroff | Aug. 15, 1950 |

OTHER REFERENCES

Reprint from "Proceedings of the National Electronics Conference, volume 2, 1946," paper on V-H-F Tuner Design by Gus Wallin and C. W. Dymond. Copy in this application file attached to Rule (75), 131 affidavit.

Article, "Coaxial Coils for F. M. Permeability Tuners" by W. J. Polydoroff, published in "Radio" January 1947, pages 9, 10, 31 and 32.